United States Patent
Lee et al.

(10) Patent No.: US 9,218,898 B2
(45) Date of Patent: Dec. 22, 2015

(54) CONDUCTIVE PASTE AND ELECTRONIC DEVICE AND SOLAR CELL INCLUDING AN ELECTRODE FORMED USING THE CONDUCTIVE PASTE

(75) Inventors: Eun Sung Lee, Seoul (KR); Suk Jun Kim, Suwon-si (KR); Se Yun Kim, Seoul (KR); Jin Man Park, Changwon-si (KR); Sang Soo Jee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 439 days.

(21) Appl. No.: 13/534,799

(22) Filed: Jun. 27, 2012

(65) Prior Publication Data

US 2013/0146135 A1  Jun. 13, 2013

(30) Foreign Application Priority Data

Dec. 9, 2011  (KR) ........................ 10-2011-0132294

(51) Int. Cl.
*H01B 1/02* (2006.01)
*H01B 1/22* (2006.01)
*H01L 31/0224* (2006.01)

(52) U.S. Cl.
CPC .......... *H01B 1/22* (2013.01); *H01L 31/022425* (2013.01); *Y02E 10/50* (2013.01)

(58) Field of Classification Search
CPC ............................................... H01L 31/022425
USPC .......... 252/512, 513, 514; 136/252, 256, 403; 429/322; 438/618
See application file for complete search history.

(56) References Cited

U.S. PATENT DOCUMENTS

| | | |
|---|---|---|
| 5,170,930 A | 12/1992 | Dolbear et al. |
| 6,120,586 A | 9/2000 | Harada et al. |
| 7,794,553 B2 | 9/2010 | Duan et al. |
| 7,888,168 B2 | 2/2011 | Weidman et al. |
| 8,129,212 B2 | 3/2012 | Wijekoon et al. |
| 8,168,886 B2 | 5/2012 | Akimoto |
| 8,207,005 B2 | 6/2012 | Weidman et al. |
| 2003/0178057 A1 | 9/2003 | Fujii et al. |
| 2005/0211340 A1 | 9/2005 | Kim et al. |
| 2006/0137778 A1 | 6/2006 | Munir et al. |
| 2007/0034305 A1 | 2/2007 | Suh |
| 2008/0146016 A1 | 6/2008 | Schwirtlich et al. |

(Continued)

FOREIGN PATENT DOCUMENTS

CN  102132422 A   7/2011
EP  1 480 233     11/2004

(Continued)

OTHER PUBLICATIONS

Hilali, et al.; Effect of Ag Particle Size in Thick-Film Ag Paste on the Electrical and Physical Properties of Screen Printed Contacts and Silicon Solar Cells; Journal of the Electrochemical Society; 153 (1) A5-A11; 2006.

(Continued)

*Primary Examiner* — Khanh Tuan Nguyen
(74) *Attorney, Agent, or Firm* — Harness, Dickey & Pierce, P.L.C.

(57) ABSTRACT

A conductive paste including a conductive powder, a metallic glass including aluminum (Al) and a first element which forms a solid solution with the aluminum (Al), and an organic vehicle.

20 Claims, 6 Drawing Sheets

(56) References Cited

U.S. PATENT DOCUMENTS

| | | |
|---|---|---|
| 2008/0251164 A1 | 10/2008 | Lohwongwatana et al. |
| 2010/0021704 A1 | 1/2010 | Yoon et al. |
| 2010/0037990 A1 | 2/2010 | Suh |
| 2010/0055822 A1 | 3/2010 | Weidman et al. |
| 2010/0170562 A1 | 7/2010 | Akimoto |
| 2010/0227433 A1 | 9/2010 | Konno |
| 2010/0269893 A1* | 10/2010 | Prince et al. .......... 136/252 |
| 2011/0000531 A1 | 1/2011 | Kwag et al. |
| 2011/0104850 A1 | 5/2011 | Weidman et al. |
| 2011/0114170 A1 | 5/2011 | Lee et al. |
| 2011/0183458 A1 | 7/2011 | Weidman et al. |
| 2011/0192457 A1 | 8/2011 | Nakayama et al. |
| 2011/0272625 A1 | 11/2011 | Wijekoon et al. |
| 2012/0031481 A1 | 2/2012 | Jee et al. |
| 2012/0037223 A1 | 2/2012 | Yamanaka et al. |
| 2012/0240994 A1 | 9/2012 | Kim et al. |

FOREIGN PATENT DOCUMENTS

| | | |
|---|---|---|
| EP | 2 325 848 | 5/2011 |
| JP | 08-064029 | 3/1996 |
| JP | 2003-217347 | 7/2003 |
| JP | 2004-250308 | 9/2004 |
| JP | 2005-093391 | 4/2005 |
| JP | 2009087957 A | 4/2009 |
| JP | 2009099371 A | 5/2009 |
| JP | 2009138266 A | 6/2009 |
| JP | 2010018878 A | 1/2010 |
| JP | 2010-238570 | 10/2010 |
| KR | 10 1998-057847 | 9/1998 |
| KR | 1998-0057847 A | 9/1998 |
| KR | 1020020037772 A | 5/2002 |
| KR | 10-2004-0080522 | 9/2004 |
| KR | 10 2005-0096258 | 10/2005 |
| KR | 10 0720940 | 5/2007 |
| KR | 10-2007-0106887 | 11/2007 |
| KR | 1020080025762 A | 3/2008 |
| KR | 10 2008 0029655 | 4/2008 |
| KR | 10 2008 0029826 | 4/2008 |
| KR | 1020090115252 A | 11/2009 |
| KR | 10 2010 0028493 | 3/2010 |
| KR | 10 2010 0048196 | 5/2010 |
| KR | 10 2010 0133867 | 12/2010 |
| KR | 1020110003803 A | 1/2011 |
| KR | 1020110040090 A | 4/2011 |
| KR | 1020110052452 A | 5/2011 |
| KR | 10 2011 0098549 | 9/2011 |
| KR | 10-2011-0112768 | 10/2011 |
| WO | 0131085 A2 | 5/2001 |

OTHER PUBLICATIONS

Office Action for corresponding U.S. Appl. No. 13/416,260 dated Aug. 1, 2014.

B Hoex et al. "On the c-Si surface passivation mechanism by the negative-chargedielectric Al2O3"; Journal of Applied Physics 104, 113703; 2008.

K. Nakamura et al. "Development of 20% Efficiency Mass Production Si Solar Cells"; 20th European Photovoltaic Solar Energy Conference; Barcelona, Spain; Jun. 2005.

V. Martinac "Effect of $TiO_2$ Addition on the Sintering Process of Magnesium Oxide from Seawater"; Sintering of Ceramics—New Emerging Techniques, p. 309-322; Mar. 2012.

PCT Search Report dated Mar. 18, 2013 for PCT/KR2012-009528.

Schubert, G. et al. "Current Transport Mechanism in Printed Ag Thick Film Contacts to an N-type Emitter of a Crystalline Silicon Solar Cell", University of Konstanz, Germany.

Schubert, G., "Thick Film Metallisation of Crystalline Silicon Solar Cells: Mechanisms, Models and Applications," Ph.D. Dissertation, Univ. Konstanz, 2006. http://kops-uni-konstanz.de/handle/123456789/9378.

U.S. Office Action mailed May 13, 2015 for corresponding U.S. Appl. No. 13/673,359.

Chinese Office Action dated Sep. 21, 2015 issued in corresponding Chinese Application No. 201280017966.5 (English translation provided).

* cited by examiner

US 9,218,898 B2

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority to Korean Patent Application No. 10-2011-0132294, filed on Dec. 9, 2011, and all the benefits accruing therefrom under 35 U.S.C. §119, the content of which in its entirety, are incorporated herein by reference.

BACKGROUND

1. Field

A conductive paste, and an electronic device and a solar cell including an electrode formed using the conductive paste, are disclosed.

2. Description of the Related Art

A solar cell is a photoelectric conversion device that transforms solar energy into electrical energy. Solar cells have attracted much attention as a potentially infinite and pollution-free next generation energy source.

A solar cell includes p-type and n-type semiconductors. A solar cell produces electrical energy when an electron-hole pair ("EHP") is produced by light absorbed in photoactive layers of the semiconductors, the EHP is transferred to the n-type and p-type semiconductors, and then the EHP is collected in electrodes of the solar cell.

A solar cell desirably has as high efficiency as possible to produce electrical energy from solar energy. In order to improve this efficiency, the solar cell desirably absorbs light with minimum loss, so that it may produce as many electron-hole pairs as possible, and then collects the produced charges without loss.

An electrode for a solar cell may be fabricated using a deposition method, which may be complicated, expensive, and take a long time. Accordingly, a simpler method of screen-printing a conductive paste including a conductive material has been suggested.

A commercially available conductive paste includes a conductive powder and glass frit. However, the glass frit has a high resistivity and thus limits the conductivity of an electrode.

Thus there remains a need for an improved conductive paste suitable for manufacturing an electrode for a solar cell.

SUMMARY

An embodiment provides a conductive paste for improving conductivity between a semiconductor substrate and an electrode.

Another embodiment provides an electronic device including an electrode fabricated using the conductive paste.

Yet another embodiment provides a solar cell including an electrode fabricated using the conductive paste.

According to an embodiment, a conductive paste including a conductive powder, a metallic glass including aluminum (Al), and a first element which forms a solid solution with the aluminum (Al), and an organic vehicle, is provided.

The first element may be contained in an amount greater than an amount equal to a solid solubility limit of the first element in the aluminum (Al).

The first element may have a solid solubility limit in the aluminum (Al) of about 0.1 atomic percent (at %) or more.

The first element may have a solid solubility limit in the aluminum (Al) in a range of about 0.1 at % to about 99.9 at %.

The first element may include at least one selected from silicon (Si), beryllium (Be), manganese (Mn), germanium (Ge), copper (Cu), gallium (Ga), lithium (Li), magnesium (Mg), silver (Ag), and zinc (Zn).

The first element may be silicon (Si), the silicon (Si) may be included in an amount greater than about 1.65 at %, which is a solid solubility limit of silicon in aluminum.

The metallic glass may include at least one second element selected from a transition element, and at least one third element selected from a rare earth element.

The first element may be silicon, the second element may be nickel, and the third element may be yttrium.

The silicon (Si) may be contained in an amount of about 1.5 at % to about 3 at %, based on a total amount of the metallic glass.

The solid solubility limit of the first element in the aluminum (Al) may be determined at a heat treatment temperature of about 200° C. to about 1000° C.

The solid solubility limit of the first element in the aluminum (Al) may be determined at a heat treatment temperature of about 500° C. to about 900° C.

The metallic glass may have a supercooled liquid region ranging from about 5K to about 200K.

The metallic glass may have a glass transition temperature ranging from about 10° C. to about 400° C.

The conductive powder may include at least one selected from silver (Ag), aluminum (Al), copper (Cu), and nickel (Ni).

The conductive paste may consist of the conductive powder, the metallic glass, and the organic vehicle, and the conductive powder may be contained in an amount of about 30 wt % to about 99 wt %, and the metallic glass may be contained in an amount of about 0.1 wt % to about 20 wt %, each based on a total weight of the conductive paste.

According to still another embodiment, an electronic device including an electrode including a product of the conductive paste is provided.

The electrode may have contact resistance of less than or equal to about 1 milliohms-square centimeters (mΩcm$^2$).

According to yet another embodiment, disclosed is a solar cell including a semiconductor substrate, and an electrode electrically connected to the semiconductor substrate, wherein the electrode comprises a product of the conductive paste.

The solar cell may further include an oxide layer disposed between the semiconductor substrate and the electrode, wherein the oxide layer may have a thickness of less than or equal to about 10 nanometers (nm).

The electrode may have contact resistance of less than or equal to about 1 mΩcm$^2$.

According to another embodiment, provided is a solar cell including a semiconductor substrate, an electrode electrically connected to the semiconductor substrate and including a metallic glass, and an oxide layer disposed between the semiconductor substrate and the electrode and having a thickness of less than or equal to about 10 nm.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
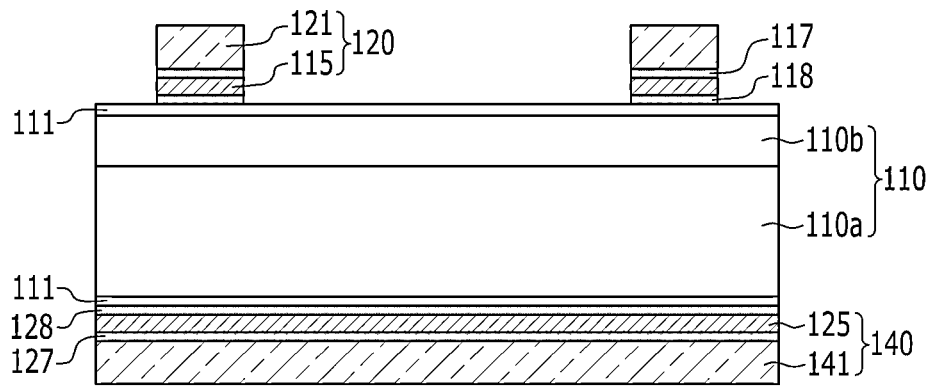
FIG. 1 is a cross-sectional view showing an embodiment of a solar cell.
Figure 2:
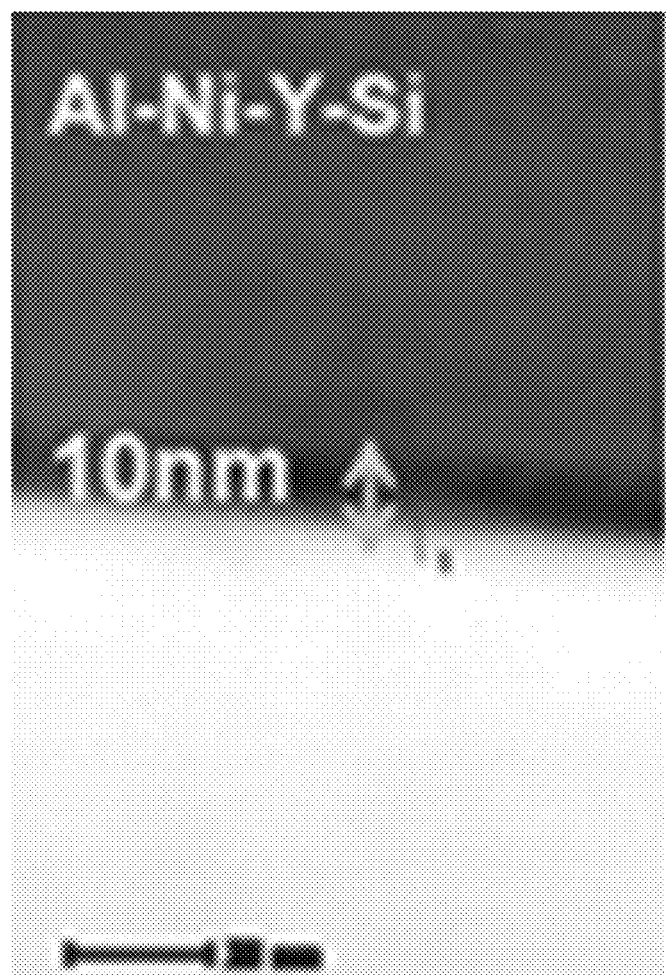
FIGS. 2 to 6 are transmission electron microscope (TEM) photographs of the electrode samples according to Examples 1 to 4 and a comparative example, respectively.
Figure 3:
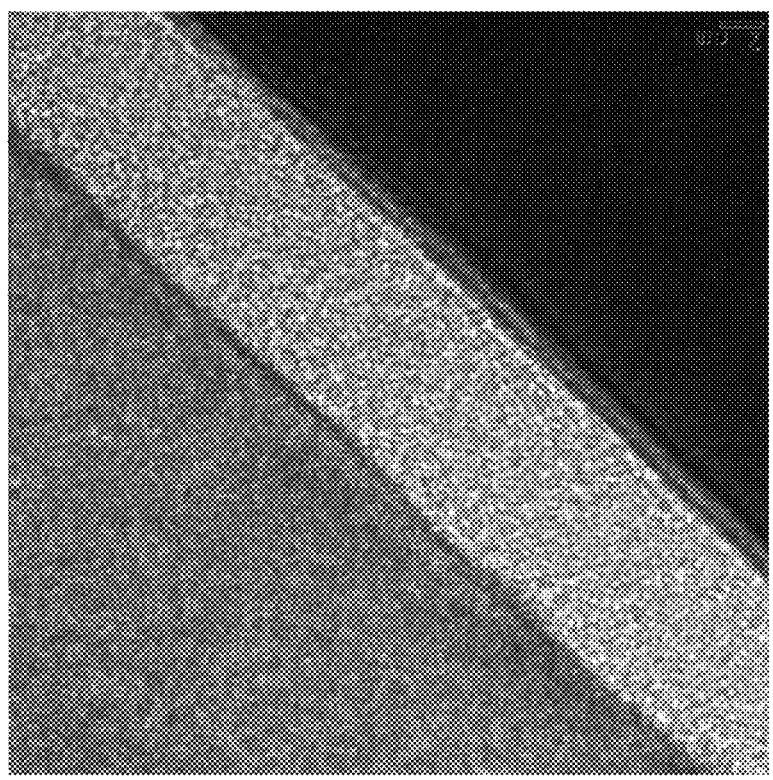
Figure 4:
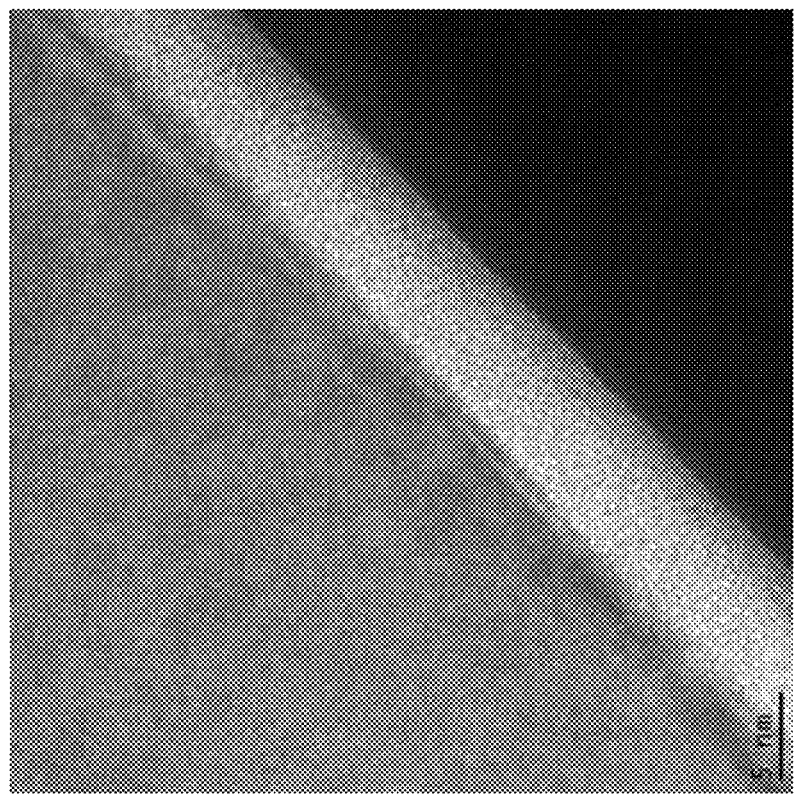
Figure 5:
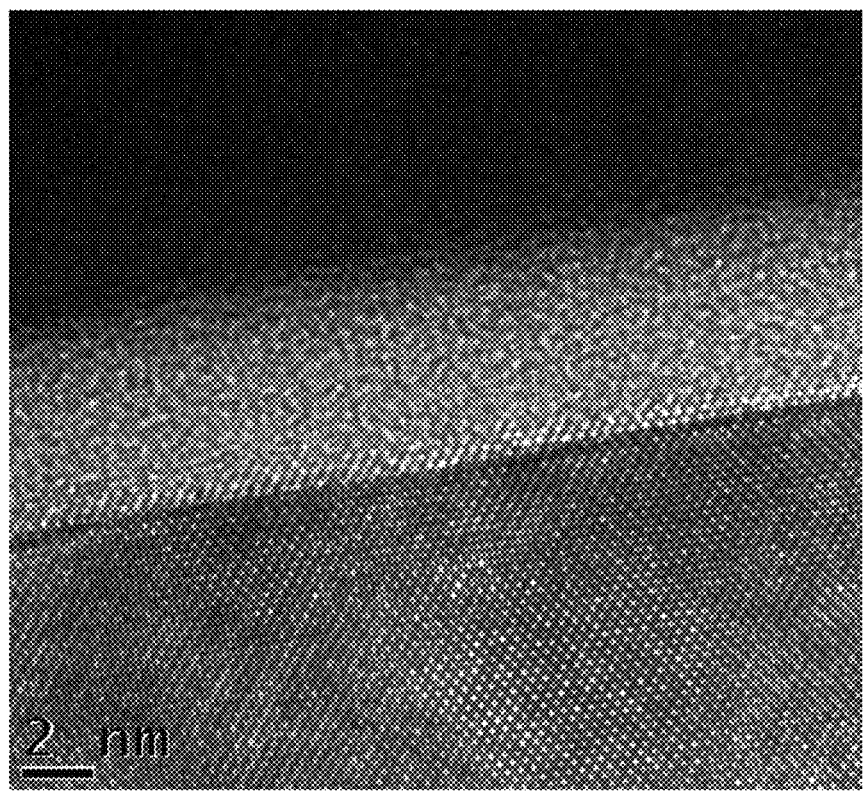
Figure 6:
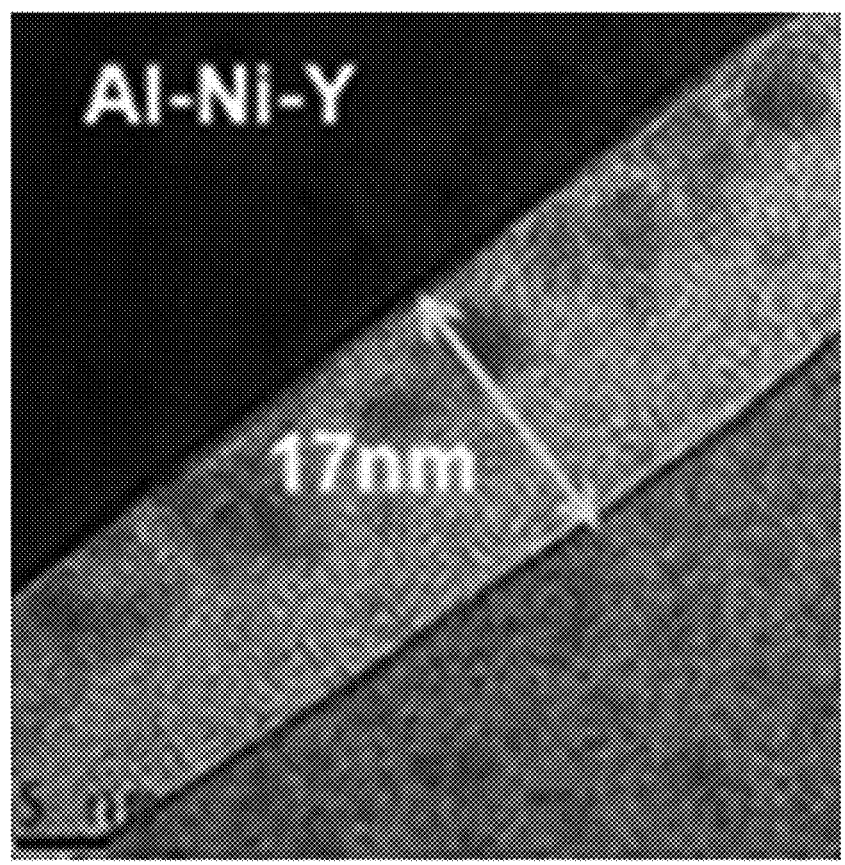

Exemplary embodiments will hereinafter be described in further detail with reference to the accompanying drawings, in which various embodiments are shown. This disclosure may, however, be embodied in many different forms and should not be construed as limited to the exemplary embodiments set forth herein.

As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. "Or" means and/or. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the term "element" may refer to a metal or a semimetal.

Recently, a conductive paste including a metallic glass instead of glass frit has been investigated. However, commercially available conductive pastes including a metallic glass may form an excessively thick oxide layer due to a chemical reaction of an element included in the metallic glass with silicon included in a semiconductor substrate. This thick oxide layer may deteriorate conductivity between the semiconductor substrate and an electrode.

First, a conductive paste according to an embodiment is further disclosed.

The conductive paste according to an embodiment comprises a conductive powder, a metallic glass, and an organic vehicle.

The conductive powder may be at least one selected from a silver (Ag)-containing metal such as silver or a silver alloy, an aluminum (Al)-containing metal such as aluminum or an aluminum alloy, a copper (Cu)-containing metal such as copper (Cu) or a copper alloy, and a nickel (Ni)-containing metal such as nickel (Ni) or a nickel alloy. However, the conductive powder is not limited thereto, and may include other metals and an additive other than the metals.

The conductive powder may have a size (e.g., an average largest particle size) ranging from about 0.1 micrometers ($\mu$m) to about 50 $\mu$m, specifically about 1 $\mu$m to about 50 $\mu$m, more specifically about 5 $\mu$m to about 30 $\mu$m. The conductive powders having different size may be included.

The conductive powder may be contained in (e.g., included in) an amount of about 30 weight percent (wt %) to about 99 wt %, specifically 35 wt % to about 95 wt %, more specifically 40 wt % to about 90 wt %, based on a total weight of the conductive paste.

The metallic glass may be an amorphous alloy having a disordered atomic structure of more than two types of elements, and may be an amorphous metal. Herein, the metallic glass may have an amorphous portion ranging from about 50 volume percent (volume %) to about 100 volume %, specifically about 70 volume % to about 100 volume %, and more specifically, about 90 volume % to about 100 volume %, based on a total volume of the metallic glass. The metallic glass has low resistivity and thus suitable conductivity, unlike an insulating glass such as a silicate.

The metallic glass includes aluminum (Al) and a first element which forms a solid solution with the aluminum (Al).

The aluminum (Al) may be a main component of the metallic glass. Herein, the main component refers to the component having a greater mole fraction than another component of the metallic glass.

The first element is a component that is capable of forming a solid solution with the aluminum (Al) when the conductive paste is heated to fabricate an electrode at a firing temperature of, for example, about 200° C. to about 1000° C., and specifically, about 500° C. to about 900° C.

The first element may be included in an amount greater than or equal to a solid solubility limit of the first element in the aluminum (Al). The solid solubility limit refers to the maximum amount of the first element that can be solvated in aluminum (Al) at a firing temperature of, for example, about 200° C. to about 1000° C., and specifically, about 500° C. to about 900° C.

The first element is a metal and/or a semimetal having a solid solubility greater than or equal to about 0.1 atomic percent (at %) in the aluminum (Al), and specifically, about 0.1 at % to about 99.9 at %. The metal and/or semimetal may include at least one selected from silicon (Si), beryllium (Be), manganese (Mn), germanium (Ge), copper (Cu), gallium (Ga), lithium (Li), magnesium (Mg), silver (Ag), and zinc (Zn).

Table 1 shows the solid solubility limit of the aforementioned first elements with aluminum (Al).

TABLE 1

| First element | Solid solubility limit in Al (at %) |
|---|---|
| Be | 1 |
| Mn | 1 |
| Si | 1.65 |
| Ge | 2 |
| Cu | 2.5 |
| Ga | 9 |
| Li | 15 |
| Mg | 19 |
| Ag | 35 |
| Zn | 67 |

The solid solubility limit provided in Table 1 refers to the solid solubility of the first element, when the sum of the first element and the aluminum (Al) is 100 at %. For example, the solid solubility of silicon (Si) is about 1.65 at %, when the sum of aluminum (Al) and the silicon (Si) is 100 at %.

As is further described above, the first element may be included in an amount greater than or equal to a solid solubility limit of the first element in the aluminum (Al). As the first element is included in an amount greater than or equal to a solid solubility limit of the first element in aluminum (Al), it may substantially or effectively prevent silicon (Si), which may be included in a semiconductor substrate, from diffusing into a softened metallic glass at a high temperature, when the conductive paste is fired to provide an electrode on a semiconductor substrate.

This will be illustrated in more detail.

A thin silicon oxide layer ($SiO_2$) is naturally formed on the surface of a semiconductor substrate, since silicon in the semiconductor substrate is naturally oxidized in air. When the conductive paste is coated on the silicon oxide layer (e.g., $SiO_2$) and heat-treated, the silicon oxide layer (e.g., $SiO_2$) is reduced by aluminum (Al) in a metallic glass to form an aluminum oxide layer (e.g., $Al_2O_3$), as shown the following Reaction Scheme 1.

$$\tfrac{4}{3}Al + SiO_2 \rightarrow \tfrac{2}{3}Al_2O_3 + Si \qquad \text{Reaction Scheme 1}$$

The silicon oxide layer (e.g., $SiO_2$) is partly removed through the reaction, and the metallic glass may directly contact the semiconductor substrate through the removed part of the silicon oxide layer (e.g., $SiO_2$).

If the metallic glass does not include the first element, and the conductive paste coated on a semiconductor substrate is fired at a higher temperature, for example, a temperature for firing an electrode, aluminum (Al) in the metallic glass may form a solid solution with silicon (Si) in the semiconductor substrate and thus may diffuse toward the semiconductor substrate, while silicon (Si) in the semiconductor substrate may diffuse inside the metallic glass. Then, the silicon (Si) diffused inside the metallic glass is oxidized and forms an approximately 15 nm-thick or thicker silicon oxide layer (e.g., $SiO_x$).

In such a mechanism, when a metallic glass including aluminum (Al) is formed into an electrode, silicon (Si) diffused from a semiconductor substrate may react with the aluminum (Al) and form a silicon oxide layer (e.g., $SiO_x$) with an excessive thickness of greater than or equal to about 15 nm between the semiconductor substrate and an electrode.

According to the embodiment, the metallic glass includes aluminum (Al) and a first element which forms a solid solution with the aluminum (Al) as described above, and may form a solid solution before the aluminum (Al) in the metallic glass forms a solid solution with silicon (Si) in the semiconductor substrate. Accordingly, the aluminum (Al) may be effectively or entirely prevented from diffusing toward the semiconductor substrate. Likewise, the silicon (Si) in the semiconductor substrate may also be effectively or entirely prevented from diffusing into the metallic glass. Thus, a silicon oxide layer may not be thick but may be but relatively thin with a thickness of less than or equal to about 10 nm, specifically about 0.1 to about 10 nm, more specifically about 0.5 to about 5 nm.

On the other hand, when the first element is included in a greater amount than a solid solubility limit of the first element in the aluminum (Al), a metallic glass including the first element may better form a solid solution with aluminum (Al).

In particular, when silicon (Si) is included in the first element, silicon atoms remaining after forming a solid solution with aluminum (Al) may be distributed inside a softened metallic glass and thus may substantially or entirely prevent silicon (Si) in the semiconductor substrate from diffusing into the metallic glass.

The metallic glass may further include a second element and a third element other than the aluminum and the first element. The second element may be at least one selected from a transition element, and the third element may be at least one selected from a rare earth elements. The transition element may be an element of Groups 3 to 12 of the Periodic Table of the Elements. The rare earth element may be selected from at least one of a lanthanide, scandium, and yttrium.

The second element may include, for example, at least one selected from scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), and mercury (Hg).

The third element may include, for example, at least one selected from lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc), and yttrium (Y).

For example, when the first element is silicon (Si), the second element is nickel (Ni), and the third element is yttrium (Y), the metallic glass may be an alloy represented by $Al_xSi_yNi_zY_w$, wherein $x+y+z+w=100$.

The metallic glass may have a glass transition temperature (Tg) of about 10° C. to about 400° C., specifically about 20° C. to about 350° C., more specifically about 30° C. to about 300° C. and a supercooled liquid region ($\Delta Tx$) of about 5K to about 200K, specifically about 10K to about 150K, more specifically about 20K to about 100K. The glass transition temperature (Tg) refers to a temperature at which the metallic glass starts to be plastically deformed. The metallic glass is softened at a temperature of higher than or equal to the glass transition temperature (Tg), and thus shows liquid-like behavior. The liquid-like behavior may be maintained a temperature region between the glass transition temperature (Tg) and the crystallization temperature (Tx), which is called the supercooled liquid region (ΔTx).

The metallic glass may be softened and may wet a semiconductor substrate in the supercooled liquid region (ΔTx). Thus, the conductive paste may have a larger and improved contact area with the semiconductor substrate.

The metallic glass may be contained (e.g., included) in an amount of about 0.1 wt % to about 20 wt %, specifically about 0.5 wt % to about 18 wt %, more specifically about 1 wt % to about 16 wt %, based on the total weight of the conductive paste.

The organic vehicle may include an organic compound which imparts a suitable viscosity to a conductive paste when combined with the conductive powder and the metallic glass, and a solvent suitable for dissolving or suspending the conductive powder and the metallic glass.

The organic compound may include, for example, at least one selected from a (meth)acrylate; a cellulose such as ethyl cellulose; a phenol; an alcohol; and a tetrafluoroethylene (e.g., Teflon); and may further include an additive such as a dispersing agent, a surfactant, a thickener, a stabilizer, or a combination thereof.

The solvent may be any solvent that is capable of dissolving or suspending any of the above compounds, and may include, for example, at least one selected from a terpineol, butylcarbitol, butylcarbitol acetate, pentanediol, dipentyne, limonene, ethylene glycol alkylether, diethylene glycol alkylether, ethylene glycol alkylether acetate, diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, and desalted water.

The organic vehicle may be included in any amount so long as the content of the organic vehicle does not adversely affect the desirable properties of the conductive paste.

The conductive paste may be suitable for use in a screen printing method and the like, and may be used to fabricate an electrode for an electronic device.

The electronic device may be, for example, a liquid crystal display ("LCD"), a plasma display device ("PDP"), an organic light emitting diode ("OLED") display, a solar cell, and the like.

The electrode may substantially or entirely prevent the aforementioned oxide layer from being excessively formed and may have contact resistance of less than or equal to about 1 milliohms-square centimeter (mΩcm²).

The electronic device may be a solar cell as is further illustrated, referring to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the spatial relationship of components will be described with respect to a semiconductor substrate 110 for better understanding and ease of description, but the present disclosure is not limited thereto. In addition, a solar energy incident side of the semiconductor substrate 110 is termed a front side and the opposite side is called a rear side, although alternative configurations are possible.

Hereinafter, referring to FIG. 1, a solar cell is described.

FIG. 1 is a cross-sectional view showing an embodiment of a solar cell.

Referring to FIG. 1, a solar cell according to an embodiment may include the semiconductor substrate 110 including a lower semiconductor layer 110a and an upper semiconductor layer 110b.

The semiconductor substrate 110 may include crystalline silicon or a compound semiconductor. The crystalline silicon may be, for example, a silicon wafer. Either of the lower semiconductor layer 110a and the upper semiconductor layer 110b may be a semiconductor layer doped with a p-type impurity, while the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element such as boron (B), and the n-type impurity may be a Group V element such as phosphorus (P).

On the semiconductor substrate 110, a thin silicon oxide layer 111 is disposed (e.g., formed). The silicon oxide layer 111 may be formed by naturally oxidizing the semiconductor substrate 110 and may have a thickness of less than or equal to about 10 nm.

On the silicon oxide layer 111, a plurality of front electrodes 120 are disposed. The front electrodes 120 may be arranged in parallel with a direction of the substrate, and may have a grid shape to reduce shadowing loss and sheet resistance.

The front electrode 120 includes a buffer layer 115 disposed in a region contacting the upper semiconductor layer 110b and a front electrode portion 121 disposed on the buffer layer 115. The front electrode portion 121 may include a conductive material. If desired, the buffer layer 115 may be omitted or partly included only in the region contacting the upper semiconductor layer 110b.

The front electrode 120 may comprise a product of the aforementioned conductive paste and may be manufactured using a screen-printing method. The conductive paste may include a conductive powder, a metallic glass, and an organic vehicle as aforementioned.

The front electrode part 121 may be formed of a conductive material, for example, a conductive material with low resistance such as silver (Ag), aluminum (Al), copper (Cu), nickel (Ni), or a combination thereof.

The buffer layer 115 may comprise a metallic glass included in the aforementioned conductive paste, and the metallic glass may be softened at a temperature higher than or equal to the glass transition temperature (Tg) of the metallic glass. The buffer layer 115 includes a metallic glass and thus is suitably conductive. In addition, the buffer layer 115 at least partly contacts the front electrode part 121 and the upper semiconductor layer 110b and enlarges the area of a path through which charges move from the upper semiconductor layer 110b to the front electrode part 121, and thus may substantially or entirely prevent loss of the charges.

Each of a first eutectic layer 117 and a second eutectic layer 118 may be respectively formed between the front electrode part 121 and the buffer layer 115 and between the buffer layer 115 and the upper semiconductor layer 110b. The first eutectic layer 117 may include a eutectic of a conductive material of the front electrode part 120 and a metallic glass of the buffer layer 115. The second eutectic layer 118 may include a eutectic of a metallic glass of the buffer layer 115 and silicon of the upper semiconductor layer 110b.

A bus bar electrode (not shown) may be disposed on the front electrode 120. The bus bar electrode may electrically connect adjacent solar cells when a plurality of the solar cells is assembled.

The thin silicon oxide layer 111 may be formed beneath the semiconductor substrate 110. The silicon oxide layer 111 may be formed by naturally oxidizing a semiconductor substrate 110, and may have a thickness of less than or equal to about 10 nm.

A rear electrode 140 is disposed (e.g., formed) beneath the silicon oxide layer 111. The rear electrode 140 may comprise a conductive material, for example, an opaque metal such as aluminum (Al). The rear electrode 140 may comprise a conductive paste, and the rear electrode may be formed using the same screen-printing method as used for the front electrode.

The rear electrode 140, like the front electrode 120, may include a buffer layer 125 disposed in a region contacting the lower semiconductor layer 110a and a rear electrode portion 141 disposed on the buffer layer 125. The rear electrode portion 141 may include a conductive material. In addition, each of a first eutectic layer 127 and a second eutectic layer 128 may be respectively formed between the rear electrode portion 141 and the buffer layer 125 and between the lower semiconductor layer 110a and the buffer layer 125.

Accordingly, an oxide layer is substantially or effectively prevented from being excessively formed between the front electrode 120 and the semiconductor substrate 110 and between the rear electrode 140 and the semiconductor substrate 110 as aforementioned, and thus the electrode may have relatively low contact resistance of less than or equal to about 1 mΩcm$^2$, specifically about 0.001 mΩcm$^2$ to about 1 mΩcm$^2$, more specifically about 0.01 mΩcm$^2$ to about 0.5 mΩcm$^2$.

Hereinafter, a method of manufacturing the solar cell of FIG. 1 is further described.

First, a semiconductor substrate 110, such as a silicon wafer, is prepared. The semiconductor substrate 110 may be doped with a p-type impurity, for example.

Then, the semiconductor substrate 110 may be subjected to a surface texturing treatment. The surface-texturing treatment may be performed with a wet method using a strong acid, such as nitric acid or hydrofluoric acid, or a strong base, such as sodium hydroxide, or by a dry method, such as plasma treatment.

Then, the semiconductor substrate 110 may be doped with an n-type impurity, for example. The n-type impurity may be doped by diffusing POCl$_3$, H$_3$PO$_4$, or the like at a high temperature. The semiconductor substrate 110 includes a lower semiconductor layer 110a and an upper semiconductor layer 110b doped with different impurities from each other.

The conductive paste for a front electrode is disposed (e.g., coated) on the front surface of the semiconductor substrate 110 where a front electrode 120 is disposed with a screen-printing method, for example, and then dried.

As is further described above, the conductive paste may include a metallic glass. The metallic glass may be prepared using any method such as melt spinning, infiltration casting, gas atomization, ion irradiation, or mechanical alloying.

Next, a conductive paste for a rear electrode is coated and dried using a screen-printing method, for example, on the rear side of the semiconductor substrate 110 to form a rear electrode 140.

Also, the rear electrode may be formed using various other methods such as inkjet printing, imprinting, or the like.

Then, the conductive paste for a rear electrode is dried.

Next, the semiconductor substrate 110 coated with the conductive paste for a front electrode and the conductive paste for a rear electrode is fired at a high temperature in a furnace. The firing may be performed at a temperature higher than the melting temperature of the conductive paste, for example, at about 200° C. to 1000° C., specifically, about 500° C. to about 900° C. However, the firing temperature is not limited thereto, and the conductive paste for front and rear electrodes may be respectively fired at the same or different temperatures.

The aforementioned conductive paste is illustrated in an example of being applied to an electrode for a solar cell, but is not limited thereto, and may be applied to an electrode for other electronic devices.

The following examples illustrate this disclosure in further detail. However, it is understood that this disclosure shall not be limited by these examples.

Fabrication an Electrode

Example 1

Silver (Ag) powder and a metallic glass of the formula $Al_{83}Ni_{5.5}Y_{10}Si_{1.5}$ are added to an organic vehicle including an ethylcellulose binder, a surfactant, and a mixed solvent of butylcarbitol/butylcarbitolacetate. Herein, the silver (Ag) powder, the metallic glass $Al_{83}Ni_{5.5}Y_{10}Si_{1.5}$, and the organic vehicle are respectively included in an amount of 82.58 wt %, 3.93 wt %, and 13.49 wt %, respectively, based on the total weight of a conductive paste.

The mixture is kneaded with a 3-roll mill, preparing a conductive paste.

The conductive paste is coated on a silicon wafer by screen-printing. The coated conductive paste is heated to about 600° C. using a belt furnace. Then, the heated conductive paste is cooled, fabricating an electrode sample.

Example 2

An electrode sample is fabricated by preparing a conductive paste according to the same method as Example 1, except that $Al_{82.5}Ni_{5.5}Y_{10}Si_2$ is used instead of $Al_{83}Ni_{5.5}Y_{10}Si_{1.5}$.

Example 3

An electrode sample is fabricated by preparing a conductive paste according to the same method as Example 1, except that $Al_{82}Ni_{5.5}Y_{10}Si_{2.5}$ is used instead of $Al_{83}Ni_{5.5}Y_{10}Si_{1.5}$.

Example 4

An electrode sample is fabricated by preparing a conductive paste according to the same method as Example 1, except that $Al_{81.5}Ni_{5.5}Y_{10}Si_3$ is used instead of $Al_{83}Ni_{5.5}Y_{10}Si_{1.5}$.

Comparative Example 1

An electrode sample is fabricated by preparing a conductive paste according to the same method as Example 1, except that $Al_{84.5}Ni_{5.5}Y_{10}$ is used instead of $Al_{83}Ni_{5.5}Y_{10}Si_{1.5}$.

Evaluation 1

The electrode sample according to Examples 1 to 4 and Comparative Example 1 are examined using a transmission electron microscope ("TEM").

The results are illustrated referring to FIGS. 2 to 6 and Table 2.

FIGS. 2 to 6 provide the transmission electron microscope ("TEM") photographs of the electrode samples according to Examples 1 to 4 and Comparative Example 1.

TABLE 2

| | $Al_{84.5-x}Ni_{5.5}Y_{10}Si_x$ | Amount of Si relative to Al (at %) | Oxide layer thickness (nm) |
|---|---|---|---|
| Example 1 | x = 1.5 | 1.78 | 10 |
| Example 2 | x = 2.0 | 2.37 | 9.5 |
| Example 3 | x = 2.5 | 2.96 | 7.5 |
| Example 4 | x = 3.0 | 3.55 | 6 |
| Comparative Example 1 | x = 0 | 0 | 17 |

Referring to FIGS. 2 to 6 and Table 2, the electrode samples according to Examples 1 to 4 have a relatively thin oxide layer having a thickness of less than or equal to about 10 nm, while the electrode sample according to Comparative Example 1 has much thicker oxide layer. Accordingly, silicon (Si) included in a metallic glass turns out to suppress formation of an oxide layer.

Evaluation 2

The electrode samples according to Examples 1 to 4 and Comparative Example 1 are measured regarding contact resistance.

The contact resistance is measured using a transmission line method ("TLM").

The results are provided in Table 3.

TABLE 3

| | $Al_{84.5-x}Ni_{5.5}Y_{10}Si_x$ | Amount of Si relative to Al (at %) | Contact resistance (mΩcm$^2$) |
|---|---|---|---|
| Example 1 | x = 1.5 | 1.78 | 0.7 |
| Example 2 | x = 2.0 | 2.37 | 0.69 |
| Example 3 | x = 2.5 | 2.96 | 0.67 |
| Example 4 | x = 3.0 | 3.55 | 0.65 |
| Comparative Example 1 | x = 0 | 0 | 2.19 |

Referring to Table 3, the electrode samples according to Examples 1 to 4 have lower contact resistance than the electrode sample according to Comparative Example 1.

Accordingly, the electrode sample fabricated using a metallic glass including aluminum (Al) and silicon (Si), which forms a solid solution with the aluminum (Al), maintains metallic glass characteristics such as a supercooled liquid region and the like, but is suppressed from forming an excessively thick oxide layer and thus has improved contact resistance against a semiconductor substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductive paste, comprising
   a conductive powder,
   a metallic glass comprising aluminum and a first element which forms a solid solution with the aluminum, the first element including at least one of silicon, beryllium, germanium, gallium, lithium, magnesium, and zinc, and
   an organic vehicle,
   wherein the metallic glass further comprises at least one second element selected from a transition element, and at least one third element selected from a rare earth element.

2. The conductive paste of claim 1, wherein the first element is contained in an amount greater than an amount equal to a solid solubility limit of the first element in the aluminum.

3. The conductive paste of claim 1, wherein the first element has a solid solubility limit in the aluminum of about 0.1 atomic percent or more.

4. The conductive paste of claim 3, wherein the first element has a solid solubility limit in the aluminum in a range of about 0.1 atomic percent to about 99.9 atomic percent.

5. The conductive paste of claim 3, wherein the first element is silicon,
   the silicon is included in an amount greater than about 1.65 atomic percent, which is a solid solubility limit of silicon in aluminum.

6. The conductive paste of claim 3, wherein the solid solubility limit of the first element in the aluminum is determined at a heat treatment temperature of about 200° C. to about 1000° C.

7. The conductive paste of claim 3, wherein the solid solubility limit of the first element in the aluminum is determined at a heat treatment temperature of about 500° C. to about 900° C.

8. The conductive paste of claim 1, wherein, in the metallic glass,
   the first element is silicon,
   the second element is nickel, and
   the third element is yttrium.

9. The conductive paste of claim 8, wherein the silicon is contained in an amount of about 1.5 atomic percent to about 3 atomic percent, based on a total amount of the metallic glass.

10. The conductive paste of claim 1, wherein the metallic glass has a supercooled liquid region ranging from about 5K to about 200K.

11. The conductive paste of claim 1, wherein the metallic glass has a glass transition temperature ranging from about 10° C. to about 400° C.

12. The conductive paste of claim 1, wherein the conductive powder comprises at least one selected from silver, aluminum, copper, and nickel.

13. The conductive paste of claim 1, wherein
   the conductive paste consists of the conductive powder, the metallic glass, and the organic vehicle, and
   the conductive powder is contained in an amount of about 30 weight percent to 99 weight percent, and
   the metallic glass is contained in an amount of about 0.1 weight percent to 20 weight percent, each based on the total weight of the conductive paste.

14. An electronic device comprising an electrode comprising a product of the conductive paste according to claim 1.

15. The electronic device of claim 14, wherein an electrode has contact resistance of less than or equal to 1 milliohms-square centimeters.

16. A solar cell comprising
   a semiconductor substrate, and an electrode electrically connected to the semiconductor substrate, wherein the electrode comprises a product of the conductive paste according to claim 1.

17. The solar cell of claim 16, further comprising an oxide layer disposed between the semiconductor substrate and the electrode, wherein the oxide layer has a thickness of less than or equal to about 10 nanometers.

18. The solar cell of claim 16, wherein the electrode has contact resistance of less than or equal to about 1 milliohms-square centimeters.

19. A solar cell comprising
a semiconductor substrate,
an electrode on the semiconductor substrate and comprising a product of the conductive paste according to claim 1, and
an oxide layer between the semiconductor substrate and the electrode and having a thickness of less than or equal to about 10 nanometers.

20. The conductive paste of claim 1, wherein the aluminum is a main component of the metallic glass.

\* \* \* \* \*